(12) United States Patent
Pai et al.

(10) Patent No.: US 8,067,700 B2
(45) Date of Patent: Nov. 29, 2011

(54) VIA STRUCTURE OF PRINTED CIRCUIT BOARD

(75) Inventors: Yu-Chang Pai, Taipei Hsien (TW); Shou-Kuo Hsu, Taipei Hsien (TW); Chien-Hung Liu, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 1051 days.

(21) Appl. No.: 11/927,710

(22) Filed: Oct. 30, 2007

(65) Prior Publication Data
US 2008/0245558 A1 Oct. 9, 2008

(30) Foreign Application Priority Data
Apr. 4, 2007 (CN) .......................... 2007 1 0200391

(51) Int. Cl.
*H05K 1/11* (2006.01)
(52) U.S. Cl. .................. 174/262; 174/265; 174/266
(58) Field of Classification Search ........... 174/258–268
See application file for complete search history.

(56) References Cited

U.S. PATENT DOCUMENTS

| 6,329,603 | B1 * | 12/2001 | Japp et al. ...................... 174/255 |
| 6,388,206 | B2 | 5/2002 | Dove et al. |
| 6,767,252 | B2 | 7/2004 | McGrath et al. |
| 6,787,710 | B2 * | 9/2004 | Uematsu et al. .............. 174/261 |
| 7,317,166 | B2 * | 1/2008 | Nakamura ..................... 174/262 |

* cited by examiner

*Primary Examiner* — Tuan T Dinh
(74) *Attorney, Agent, or Firm* — Altis Law Group, Inc.

(57) ABSTRACT

A printed circuit board (200) includes at least one via (280) defined therein, the via has an upper cap (220) formed on a top surface of the PCB, and a lower cap (240) formed on a bottom surface of the PCB. A conductive hole (290) is defined in the PCB having a plated sidewall (230) plated on its inner surface, and a first clearance hole (271) is defined in a first inner layer (260) of the PCB around the sidewall. A first transmission line (210) defined on the top surface of the PCB is coupled to the upper cap, a first void (273) extending from a boundary of the first clearance hole being disposed along the layout direction of the first transmission line.

1 Claim, 4 Drawing Sheets

VIA STRUCTURE OF PRINTED CIRCUIT BOARD

BACKGROUND

1. Field of the Invention

The present invention relates to printed circuit boards, and particularly to the structure of a via of a printed circuit board.

2. Description of Related Art

As well known to those skilled in the art, a conventional printed circuit board (PCB) functions to connect various electronic components to each other on the PCB along a predetermined pattern, and is applied to various electronic goods such as home appliances including digital televisions and advanced telecommunication equipment. A conventional PCB comprises a copper plate on which a circuit pattern is formed, and at least an inner layer.

FIG. 3 is an isometric cutaway view of a portion of a conventional PCB 100 defining a via 180 and a plurality of inner layers 160. The via 180 includes an upper cap (annular ring) 120, a conductive hole 190, a plated sidewall 130, a plurality of clearance holes 170, and a lower cap (annular ring) 140. The clearance holes 170 are circular shaped around the plated sidewall 130 in the inner layers of the PCB 100. Two transmission lines 110, 150 respectively coupled to the upper cap 120 and the lower cap 140, and communicate with each other through the via 180.

The capacitance of the via 180 which depends on the area of the clearance holes 170 is one of the most important parameters for PCB designers, because the capacitance of the via 180 may reduce the quality of a signal transmitted through the via 180.

What is needed, therefore, is a printed circuit board which can solve the above problem.

SUMMARY

An exemplary printed circuit board includes at least one via defined therein, the via has an upper cap formed on a top surface of the PCB, and a lower cap formed on a bottom surface of the PCB. A conductive hole is defined in the PCB having a plated sidewall, and a first clearance hole is defined in a first inner layer of the PCB around the sidewall. A first transmission line defined on the top surface of the PCB is coupled to the upper cap, a first void extending from a boundary of the first clearance hole being disposed along the layout direction of the first transmission line.

Other objects, advantages and novel features of the present invention will become more apparent from the following detailed description of preferred embodiments when taken in conjunction with the accompanying drawings, in which:

DETAILED DESCRIPTION

Figure 1:
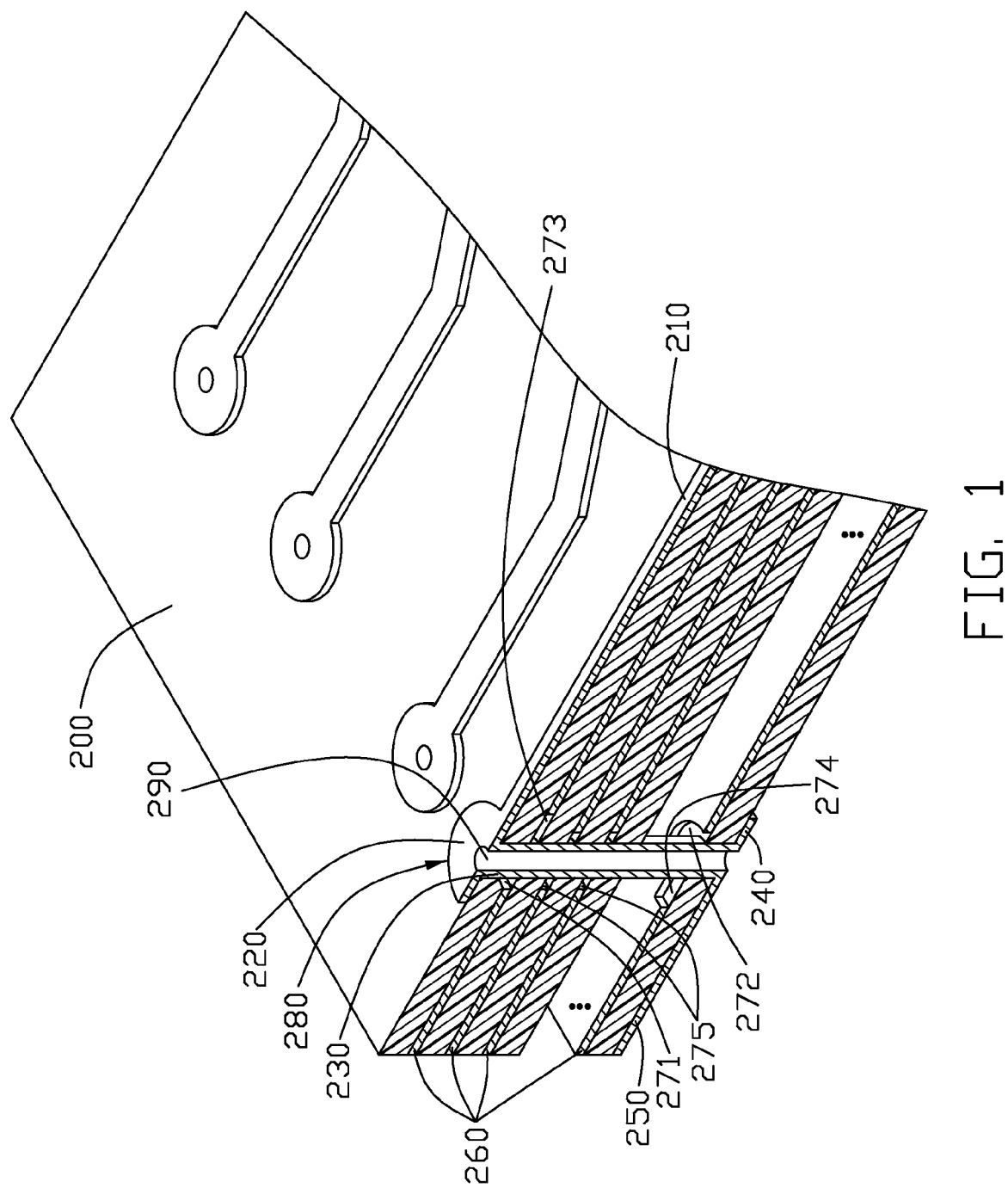
FIG. 1 is an isometric cutaway view of one embodiment of a printed circuit board with vias in accordance with the present invention.
Figure 2:
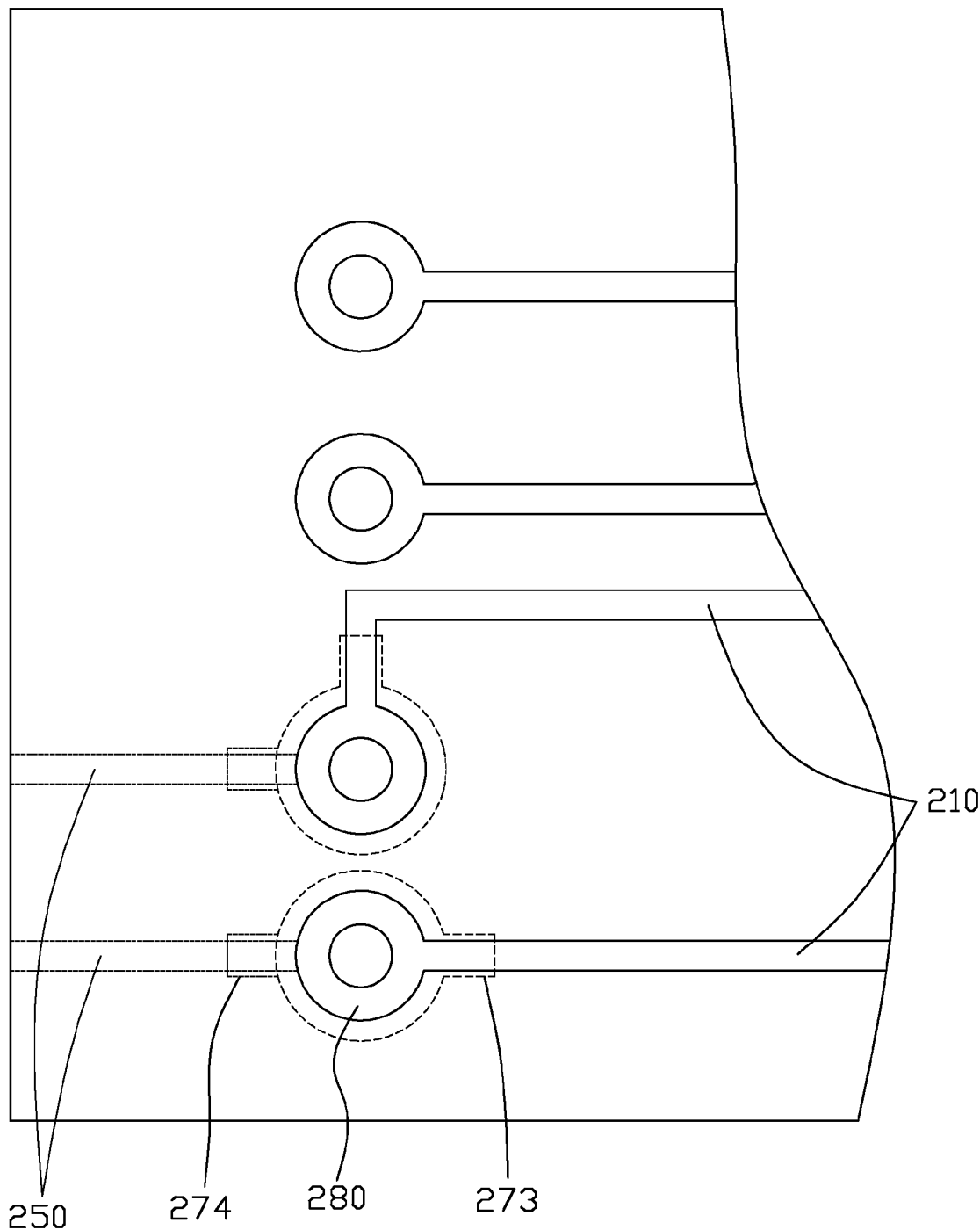
FIG. 2 is a schematic top plane diagram of the printed circuit board with vias of FIG. 1.

Referring to FIG. 1 and FIG. 2, a PCB 200 in accordance with an embodiment of the present invention includes a via 280 and a plurality of inner layers 260. The via 280 includes an upper cap 220, a conductive hole 290, a first clearance hole 271, a second clearance hole 272, and a lower cap 240.

The conductive hole 290 has a plated sidewall 230. A first transmission line 210 disposed on the exposed surface of the top layer of the PCB 200 is coupled to the upper cap 220, and a second transmission line 250 disposed on the bottom surface of the bottom layer of the PCB 200 is coupled to the lower cap 240. The first and second transmission lines 210, 250 communicate with each other through the via 280. The first clearance hole 271 is formed around the sidewall 230 in the inner layer 260 adjacent the top layer. The second clearance hole 272 is formed around the sidewall 230 in the inner layer 260 adjacent the bottom layer. The first clearance hole 271 has a first void 273 defined along the layout direction of the first transmission line 210, and the second clearance hole 272 has a second void 274 defined along the layout direction of the second transmission line 250. The other inner layers 260 also have clearance holes 275.

In this embodiment, the clearance holes 271, 272 are circular shaped, and the diameter of the clearance holes 271, 272 is greater than the diameter of the caps 220, 240. The first void 273 and the second void 274 are rectangular shaped or oval shaped. The first void 273 is defined at a side of the first clearance hole 271 right under the first transmission line 210, the second void 274 is defined at a side of the second clearance hole 272 right above the second transmission line 250. The first void 273 and the second void 274 increases the area of the clearance holes 271, 275, so that the capacitance of the via 280 is reduced and the impedance of the via 280 is increased. In this embodiment, the via 280 is a through hole, the via 280 can also be a blind via or a buried via.

Figure 3:
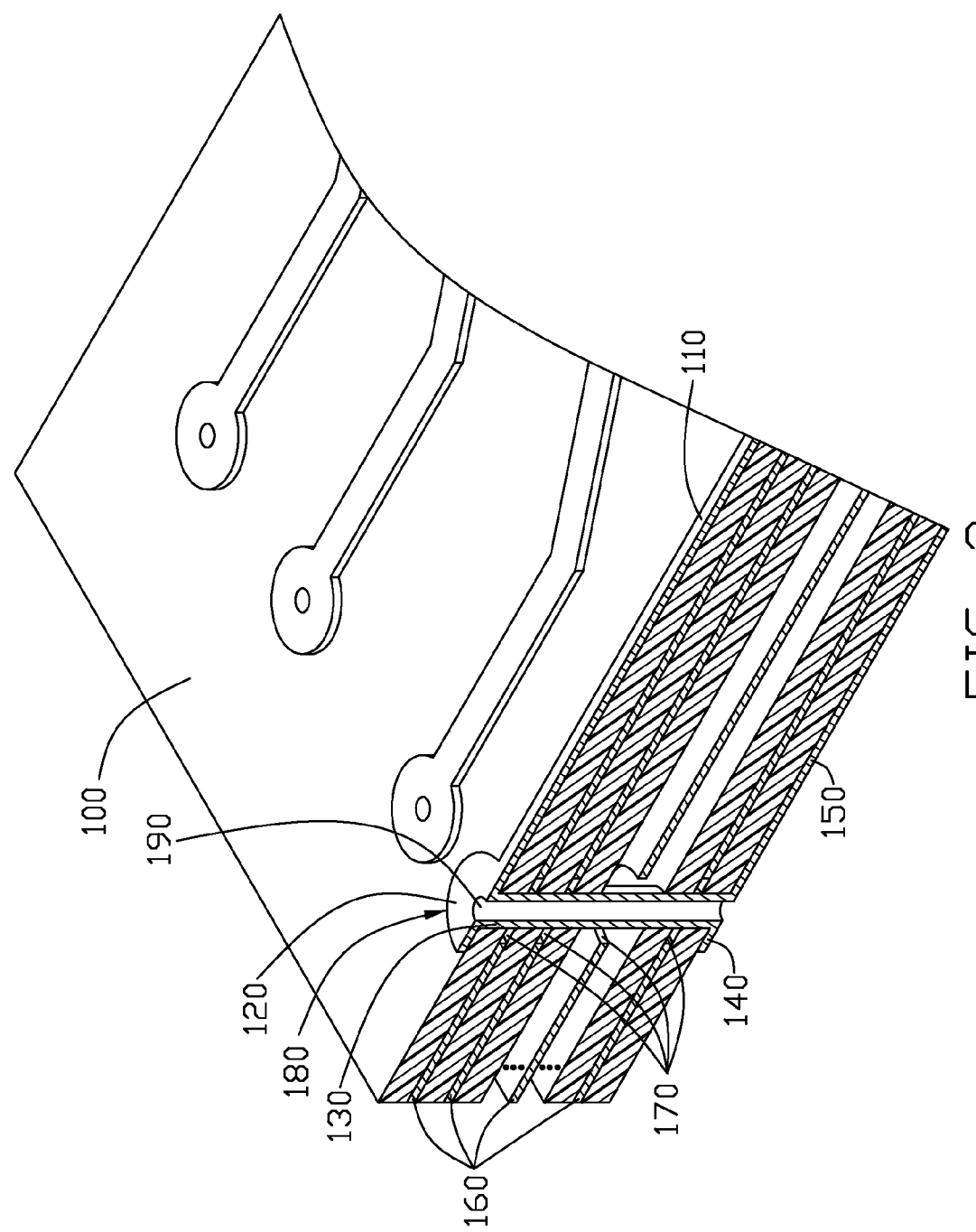
FIG. 3 is an isometric cutaway view of a portion of a conventional printed circuit board with vias.
Figure 4:
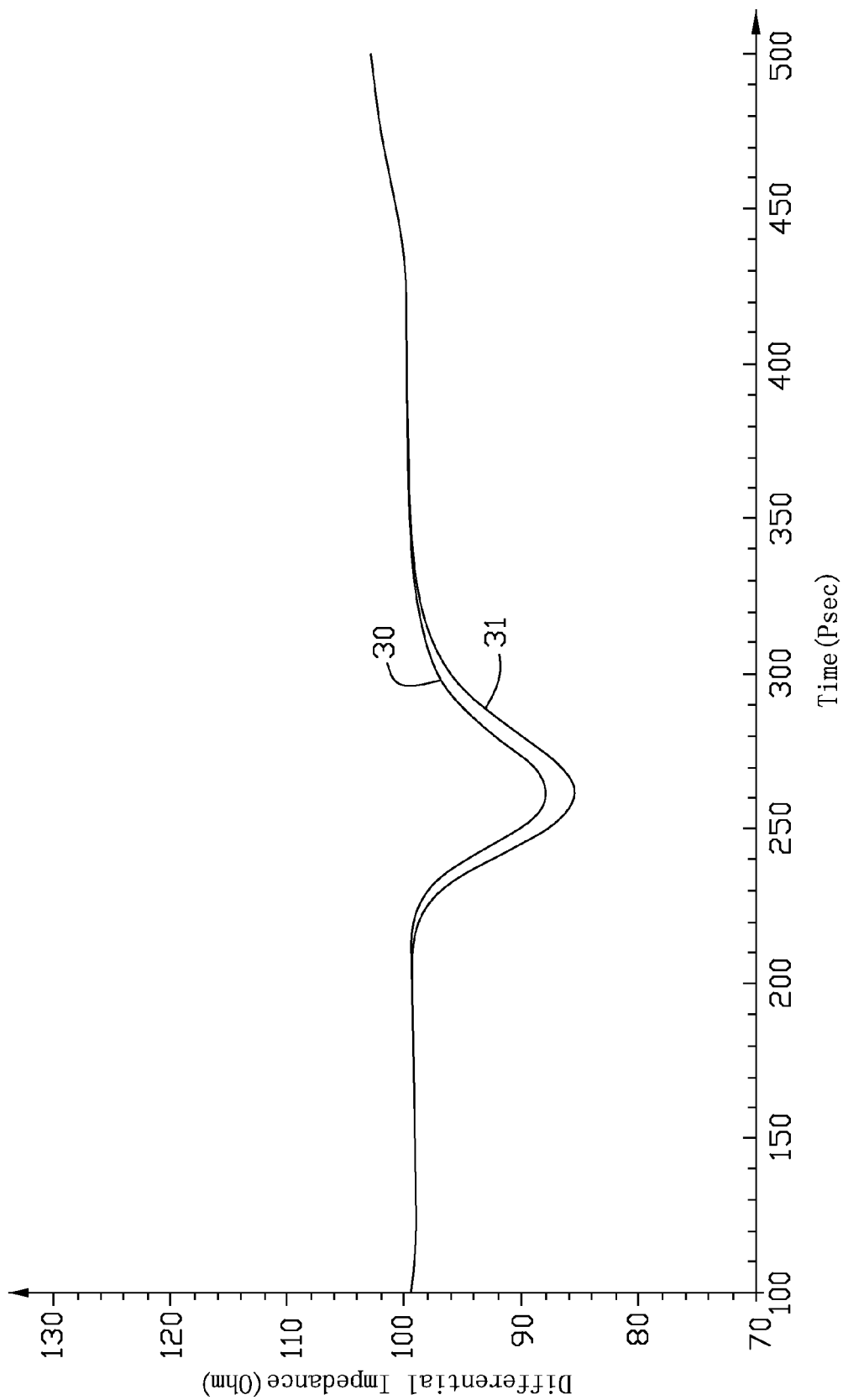
FIG. 4 is a comparative graph showing impedance waveforms of transmission lines obtained with the printed circuit boards of FIG. 1 and FIG. 3.

FIG. 4 is a comparative graph showing impedance curves of transmission lines obtained with the printed circuit board of FIG. 1 and a conventional printed circuit board of FIG. 3 using a Time-Domain Reflectometer (TDR). Curves 31, 30 respectively represent the conventional PCB and the PCB of the embodiment, depressed portions of the curves 31, 30 show the impedance discontinuity effect of the transmission lines at the vias 180, 280. It can be seen that capacitance of the via 280 is reduced and impedance of the via 280 is increased, which means signal integrity at the via 280 is improved.

The foregoing description of the exemplary embodiment of the invention has been presented only for the purposes of illustration and description and is not intended to be exhaustive or to limit the invention to the precise forms disclosed. Many modifications and variations are possible in light of the above teaching. The embodiment was chosen and described in order to explain the principles of the invention and its practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiment described therein.

What is claimed is:

1. A printed circuit board (PCB) comprising:
a via with a conductive hole defined in the PCB, the conductive hole having a plated sidewall;
a top layer with a first transmission line coupled to an upper cap of the via;
a bottom layer;
a first inner layer defined between the top layer and the bottom layer; and
a first clearance hole defined in the first inner layer around the sidewall, a first extended void extending from the first clearance hole and defined in a layout direction and right under the first transmission line,
wherein the first clearance hole is circular shaped, the first clearance hole has a diameter greater than that of the upper cap, and the first extended void has a width greater than that of the first transmission line.

* * * * *